United States Patent
McClellan et al.

(10) Patent No.: US 10,644,834 B1
(45) Date of Patent: May 5, 2020

(54) EFFICIENT ETHERNET MULTI-MODE CODING AND MODULATION FOR TWISTED-PAIR

(71) Applicant: Marvell International Ltd., Hamilton (BM)

(72) Inventors: Brett Anthony McClellan, Laguna Hills, CA (US); Ming-Tak Leung, Irvine, CA (US); Xing Wu, Palo Alto, CA (US)

(73) Assignee: MARVELL INTERNATIONAL LTD., Hamilton (BM)

( * ) Notice: Subject to any disclaimer, the term of this patent is extended or adjusted under 35 U.S.C. 154(b) by 101 days.

(21) Appl. No.: 16/050,082

(22) Filed: Jul. 31, 2018

Related U.S. Application Data

(60) Provisional application No. 62/542,731, filed on Aug. 8, 2017.

(51) Int. Cl.
    *H04L 1/00*     (2006.01)
    *H03M 13/00*     (2006.01)
    *H04L 29/08*     (2006.01)

(52) U.S. Cl.
    CPC ...... *H04L 1/0045* (2013.01); *H03M 13/6306* (2013.01); *H04L 1/0009* (2013.01); *H04L 1/0057* (2013.01); *H04L 1/0078* (2013.01); *H04L 69/323* (2013.01)

(58) Field of Classification Search
    CPC ... H04L 1/0045; H04L 1/0009; H04L 1/0057; H04L 69/323; H04L 1/0078; H03M 13/6306

USPC .............. 714/760, 752, 784, 786, 821, 712; 375/295, 316

See application file for complete search history.

(56) References Cited

U.S. PATENT DOCUMENTS

| | | | |
|---|---|---|---|
| 7,778,334 B2 * | 8/2010 | Belogolovyi | ....... H04L 25/4917 375/260 |
| 7,809,021 B2 | 10/2010 | McClellan | |
| 9,451,057 B1 | 9/2016 | McClellan | |
| 9,577,708 B1 * | 2/2017 | McClellan | ............... H04B 3/46 |

(Continued)

OTHER PUBLICATIONS

Zhang et al., An Efficient 10GBASE-T Ethernet LDPC Decoder Design With Low Error Floors, Apr. 2010, IEEE, vol. 45, No. 4, pp. 843-855 (Year: 2010).*

(Continued)

*Primary Examiner* — John J Tabone, Jr.

(57) ABSTRACT

A method for communication, including, in a Physical Layer (PHY) transceiver, selecting a transmission bitrate from a plurality of transmission bitrates, for transmitting over a media interface bits received from an external device. The received bits are processed by generating, using a framing and encoding scheme that depends on at least the selected transmission bitrate, frames having a common frame length among the framing and encoding schemes. The frames are encoded to produce code words of a predefined Forward Error Correction Code (FEC) code, using a single FEC encoder that accepts a number of bits for encoding equal to the frame length. Sub-units of the code words are mapped into symbols using one of at least two mapping schemes that employ different voltage amplitude levels to define a transmission symbol, the mapping scheme being selected according to the selected transmission bitrate. The symbols are transmitted over the media interface.

22 Claims, 7 Drawing Sheets

(56) References Cited

U.S. PATENT DOCUMENTS

| | | | |
|---|---|---|---|
| 9,716,529 B1* | 7/2017 | Dai | H04B 3/04 |
| 9,749,237 B2 | 8/2017 | Lo | |
| 9,819,444 B2* | 11/2017 | Shen | H04L 1/0041 |
| 9,838,072 B1* | 12/2017 | Dai | H04B 3/04 |
| 9,853,803 B1 | 12/2017 | Lo | |
| 9,866,425 B1* | 1/2018 | Lo | H04L 41/042 |
| 9,882,747 B2* | 1/2018 | Dai | H04B 3/237 |
| 10,361,721 B1* | 7/2019 | Lo | H03M 13/31 |
| 10,447,431 B2* | 10/2019 | Shen | H04L 67/12 |
| 2003/0018975 A1* | 1/2003 | Stone | G08B 13/1966 725/105 |
| 2005/0005189 A1* | 1/2005 | Khermosh | H04L 1/0057 714/4.1 |
| 2007/0087771 A1* | 4/2007 | Noble | H04B 17/0085 455/522 |
| 2010/0077275 A1* | 3/2010 | Yu | H03M 13/114 714/752 |
| 2011/0307754 A1* | 12/2011 | Sun | H03M 13/033 714/752 |
| 2011/0318009 A1* | 12/2011 | Shiba | H04L 12/2885 398/67 |
| 2014/0003813 A1* | 1/2014 | Pfau | H04J 14/06 398/65 |
| 2014/0056593 A1* | 2/2014 | DeAndrea | H04B 10/40 398/135 |
| 2015/0263762 A1* | 9/2015 | Shen | H03M 13/1111 701/3 |
| 2015/0319272 A1* | 11/2015 | Varadarajan | H04B 3/54 370/392 |
| 2015/0326348 A1* | 11/2015 | Shen | H04L 1/0041 714/776 |
| 2017/0180161 A1* | 6/2017 | Dai | H04B 3/237 |
| 2018/0034583 A1* | 2/2018 | Low | H04L 1/0045 |
| 2018/0041303 A1* | 2/2018 | Shen | H04L 27/04 |
| 2018/0041304 A1* | 2/2018 | Shen | H04L 1/0042 |
| 2018/0152326 A1* | 5/2018 | Dai | H04B 3/237 |

OTHER PUBLICATIONS

IEEE Std 802.3bp™, "IEEE Standard for Ethernet—Amendment 4: Physical Layer Specifications and Management Parameters for 1 Gb/s Operation over a Single Twisted-Pair Copper Cable", 211 pages, Jun. 30, 2016.

IEEE Std 802.3bq™m "IEEE Standard for Ethernet—Amendment 3: Physical Layers and Management Parameters for 25 Gb/s and 40 Gb/s Operation,Types 25GBASE-T and 40GBASE-T", 211 pages, Jun. 30, 2016.

Dalmia et al., "Technical Feasibility of 10G over 1 TP", AQUANTIA, 8 pages, Jan. 2017.

Zimmerman et al.,"Technical Feasibility of 10Gbps PHYs on 1 pair SFTP", IEEE 802.3—Multigig Automotive Ethernet PHY Study Group, 9 pages, Jan. 2017.

* cited by examiner

EFFICIENT ETHERNET MULTI-MODE CODING AND MODULATION FOR TWISTED-PAIR

CROSS-REFERENCE TO RELATED APPLICATIONS

This application claims the benefit of U.S. Provisional Patent Application 62/542,731, filed Aug. 8, 2017, whose disclosure is incorporated herein by reference.

FIELD OF THE DISCLOSURE

The present disclosure relates generally to communication systems, and particularly to methods and systems for implementing multi-mode Ethernet PHY transceivers.

BACKGROUND

High speed communication over wire is required in various fields such as Ethernet for automotive and industrial applications. Vendors and standardization bodies are therefore working to develop suitable communication solutions and standards.

The IEEE 802.3 (Ethernet) is a working group developing a collection of standards defining the Physical Layer (PHY) and data link layer's Media Access Control (MAC) of wired Ethernet.

An IEEE 802.3 standard for 1 Gbps Ethernet over a single twisted pair, also known as 1000BASE-T1, is specified in the IEEE standard 802.3 Bp™-2016, entitled "Standard for Ethernet Amendment 4: Physical Layer Specifications and Management Parameters for 1 Gb/s Operation over a Single Twisted Pair Copper Cable," Jun. 30, 2016. The 1000BASE-T1 standard defines the Physical Layer (PHY) specifications and management parameters for point-to-point full duplex 1 Gbps Ethernet operation over single balanced twisted-pair cabling. In the description that follows, the terms "1000BASE-T1 standard" and "IEEE802.3 standard" are used interchangeably.

The description above is presented as a general overview of related art in this field and should not be construed as an admission that any of the information it contains constitutes prior art against the present patent application.

SUMMARY

An embodiment that is described herein provides a method for communication, including, in a Physical Layer (PHY) transceiver, selecting a transmission bitrate from a plurality of predefined transmission bitrates that respectively differ one from another, for transmitting over a media interface a plurality of bits received for transmission from a device external to the PHY transceiver. The received bits are processed, by generating, using a framing and encoding scheme that is dependent on at least the selected transmission bitrate, one or more frames having a predefined frame length that is common among the framing and encoding schemes for transmitting the received bits at the predefined transmission bitrates. The bits of the one or more frames are encoded, so as to produce one or more respective code words of a predefined Forward Error Correction Code (FEC) code, using a single FEC encoder that accepts a number of bits for encoding equal to the predefined frame length, the single FEC encoder is reused among the framing and encoding schemes for transmitting the received bits at one of the predefined plurality of transmission bitrates. Sub-units of the code words are mapped into transmission symbols for transmitting over the media interface using one of at least two different mapping schemes that respectively employ different voltage amplitude levels to define a transmission symbol, the mapping scheme being selected according to the selected transmission bitrate. The transmission symbols are transmitted over the media interface.

In some embodiments, processing the received bits includes processing the received bits using a first framing and encoding scheme when the selected transmission bitrate is a lowest transmission bitrate among the plurality of transmission bitrates, and using a second framing and encoding scheme, that is different from the first framing and encoding scheme, when the selected transmission bitrate is higher than the lowest transmission bitrate, the first framing and encoding scheme is specified in a 1000BASE-T1 standard for 1 Gbs Ethernet communication over a twisted-pair link. In other embodiments, selecting the transmission bitrate includes selecting a transmission bitrate other than a lowest transmission bitrate among the plurality of transmission bitrates, and including establishing a link with a peer link partner by performing a link training process specified for the lowest transmission bitrate. In yet other embodiments, mapping the sub-units includes mapping 3-bit units into 3-level PAM symbols when the selected transmission bitrate is a lowest transmission bitrate among the plurality of transmission bitrates, and into 8-level PAM symbols when the selected transmission bitrate is higher than the lowest transmission bitrate.

In an embodiment, the method further includes receiving the received bits in single-byte units when the selected transmission bitrate is a lowest transmission bitrate among the plurality of transmission bitrates, and in four-byte units when the selected transmission bitrate is higher than the lowest transmission bitrate. In another embodiment, processing the received bits includes packing a predefined number of the received bits in the frames to match a baud rate derived from a common Ethernet reference clock signal. In yet another embodiment, generating each of the one or more frames, when the selected transmission bitrate is higher than the lowest transmission bitrate, includes encoding eight-byte groups of the received bits into respective sub-frames having a predefined length, and aggregating a predefined number of the sub-frames and an extension part to match the predefined frame length.

There is additionally provided, in accordance with an embodiment that is described herein an apparatus that includes an interface, a Forward Error Correction Code (FEC) encoder, a mapper/modulator and a processor. The interface is configured to receive bits for transmission over a media interface, wherein the bits are received from a device external to the apparatus at a transmission bitrate selected from a plurality of predefined transmission bitrates that respectively differ from one another. The FEC encoder is a single FEC encoder that is reused for any transmission bitrate selected from the plurality of the predefined transmission bitrates, and that accepts a number of bits for encoding equal to a predefined frame length. The mapper/modulator is configured to process the received bits, by generating, using a framing and encoding scheme that is dependent on at least the selected transmission bitrate, one or more frames having a predefined frame length that is common among the framing and encoding schemes, to encode the bits of the one or more frames using the predefined FEC encoder, so as to produce one or more respective code words of the predefined FEC, to map sub-units of the code words into transmission symbols for transmitting over the media interface using one of at least two different mapping schemes that respectively employ different voltage amplitude levels to define a transmission symbol, the mapping scheme being selected according to the selected transmission, and to transmit the transmission symbols over the media interface. The processor is configured to select the transmission bitrate from the plurality of the predefined transmission bitrates, and to configure the FEC encoder and the mapper/modulator with the selected transmission bitrate.

There is additionally provided, in accordance with an embodiment that is described herein a method for communication, including, in a Physical Layer (PHY) transceiver, selecting a transmission bitrate, from among a plurality of predefined transmission bitrates that respectively include a 1 Gbps bitrate and one or more of a 2.5 Gbps, 5 Gbps and 10 Gbps transmission bitrate, for transmitting over a media interface a plurality of bits received for transmission from a device external to the PHY transceiver. The received bits and additional bits are processed to generate one or more frames having a predefined frame length, using a framing and encoding scheme that for the 1 Gbps transmission bitrate processes the received bits and the additional bits according to a 1000BASE-T1 mode of transmission. The bits of the one or more frames are encoded, using a Forward Error Correction (FEC) code encoder for transmission according to the 1000BASE-T1 mode of transmission, to produce a plurality of code words of a respective FEC code. Sub-units of the code words are selectively mapped into transmission symbols according to (i) a 3-level PAM modulation scheme for transmitting the received bits over the media interface at the 1 Gbps transmission bitrate according to 1000BASE-T1 mode, or (ii) according to a higher level PAM modulation scheme for transmitting the received bits over the media interface at a transmission bitrate that is higher than the 1 Gbps transmission bitrate. The transmission symbols are transmitted over the media interface according to the selected mapping.

There is additionally provided, in accordance with an embodiment that is described herein, an apparatus for communication, including a processor, an interface and a mapper/modulator. The processor is configured to select a transmission bitrate, from among a plurality of predefined transmission bitrates that respectively include a 1 Gbps bitrate and one or more of a 2.5 Gbps, 5 Gbps and 10 Gbps transmission bitrate. The interface is configured to receive from a device external to the apparatus a plurality of bits for transmission over a media interface. The mapper/modulator is configured to process the received bits and additional bits to generate one or more frames having a predefined frame length, using a framing and encoding scheme that for the 1 Gbps transmission bitrate processes the received bits and the additional bits according to a 1000BASE-T1 mode of transmission, to encode the bits of the one or more frames, using a Forward Error Correction (FEC) code encoder for transmission according to the 1000BASE-T1 mode of transmission, to produce a plurality of code words of a respective FEC code, to selectively map sub-units of the code words into transmission symbols according to (i) a 3-level PAM modulation scheme for transmitting the received bits over the media interface at the 1 Gbps transmission bitrate according to 1000BASE-T1 mode, or (ii) according to a higher level PAM modulation scheme for transmitting the received bits over the media interface at a transmission bitrate that is higher than the 1 Gbps transmission bitrate, and to transmit the transmission symbols over the media interface according to the selected mapping.

The present disclosure will be more fully understood from the following detailed description of the embodiments thereof, taken together with the drawings in which:

DETAILED DESCRIPTION OF EMBODIMENTS

Figure 1A:
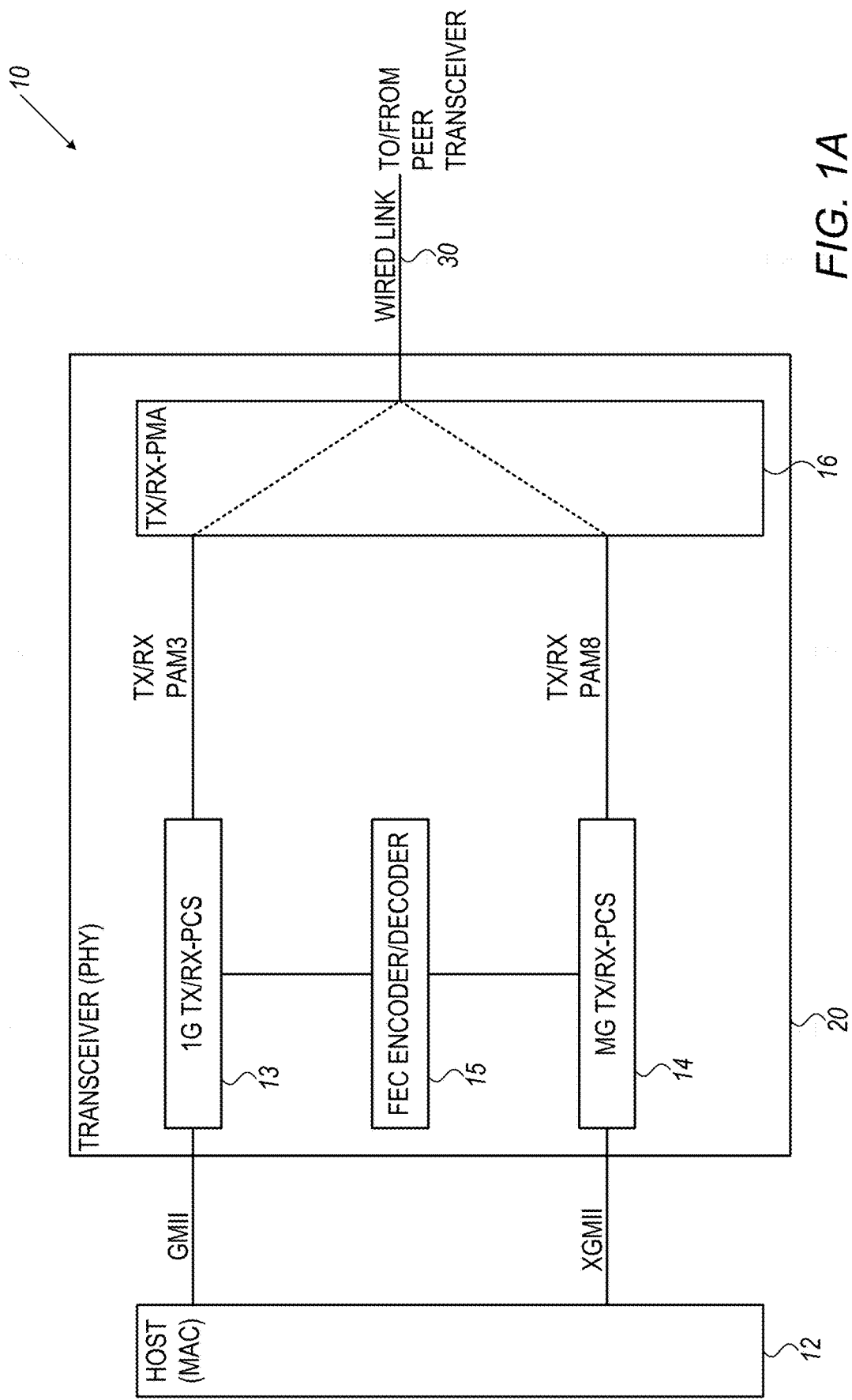
FIG. 1A is a block diagram that schematically illustrates an Ethernet communication system, including a multi-mode Physical Layer (PHY) transceiver, in accordance with an embodiment that is described herein.

The demand for efficient Physical Layer (PHY) for high-speed communication over wire is growing in various technological fields. For example, the 1000BASE-T1 standard cited above supports Ethernet communication over a twisted-pair cable at a 1 Gbps bitrate, and is suited for automotive and industrial networking applications. In full duplex communication two parties (or clients) communicate with one another simultaneously, in both directions, over a single wired link.

Embodiments that are described herein provide methods and systems for multi-mode Ethernet communication over a wired link, i.e., at multiple bitrates higher than and possibly including 1 Gbps. The disclosed techniques are suitable for use in emerging fields such as automotive systems, e.g., in autonomous vehicles, in which a vehicular backbone network is required to operate at speeds of 1 Gbps or higher.

Proposals for Ethernet communication over a twisted-pair cable at bitrates up to 10 Gbps have been presented, for example, by the IEEE 802.3 MultiGigabit Automotive Ethernet PHY Study Group, in "TECHNICAL FEASIBILITY OF 10G OVER 1 TP," January, 2017, and in "Technical Feasibility of 10 Gbps PHYs on 1 pair SFTP," January, 2017. In principle, according to these proposals, bitrates of 10 Gbps, 5 Gbps and 2.5 Gbps are achievable on a single twisted-pair cable using a modulation scheme based on the IEEE 802.3bq standard (40GBASE-T) using a Double Square 128 (DSQ-128) (16-level) modulation constellation, and a coding scheme that combines Low-Density Parity-Check (LDPC) encoding with Reed Solomon (RS) encoding.

The principle disadvantages of the coding and modulation schemes proposed by the IEEE 802.3 working group include (i) high complexity in implementing the DSQ-128 modulation scheme compared to a PAM3 modulation scheme defined in the 1000BASE-T1 standard, (ii) a training time for link establishment longer than 2 seconds, compared to a 100 milliseconds training time in the 1000BASE-T1 standard, and (iii) for bitrates higher than 1 Gbps, dedicated elements other than those specified in the 1000BASE-T1 standard are required, such as the Physical Coding Sublayer (PCS), Physical Media Attachment (PMA), and link training signaling and control.

In some disclosed embodiments, a low complexity multi-mode Ethernet PHY transceiver supports selectable transmission bitrates including 1 Gbps, 2.5 Gbps, 5 Gbps and 10 Gbps. In one embodiment, the 1 Gbps is omitted. In the disclosed embodiments, the same Forward Error Correction (FEC) code specified for the 1000BASE-T1 standard is reused for transmission at each of the 2.5 bps, 5 Gbps and 10 Gbps bitrates. Reusing hardware implementations of the 1000BASE-T1 Reed Solomon (RS) FEC encoder and decoder for higher than 1 Gbps bitrates reduces the size, cost and power dissipation of the disclosed PHY transceiver.

In some embodiments, the PHY transceiver reuses the fast (100 milliseconds) PAM2 link training signaling, message exchange mechanism, boundary alignment and sequencing defined for 1 Gbps in the 1000BASE-T1 standard, for link establishment at the supported bitrates higher than 1 Gbps. This simplifies the PHY transceiver implementation and avoids interoperability issues.

In an embodiment, at a 1 Gbps bitrate, the PHY transceiver uses the 3-Bit to 2-Ternary (3B2T) symbol mapping specified in the 1000BASE-T1 standard. At bitrates higher than 1 Gbps, the PHY transceiver maps bits to symbols using a 3-bit to 8-level PAM mapping, which is aligned to the 9-bit symbols of the RS-FEC code.

In some embodiments, the PHY transceiver employs a block coding and frame construction scheme, which result in a baud rate that is a convenient multiple of the frequency of a reference clock signal commonly used as a reference clock in Ethernet PHY. For example, in an embodiment, a baud rate of 937.5 Mbaud is generated by multiplying a 25 MHz reference clock signal by a factor of 75/2, or by multiplying a 156.25 MHz reference clock signal by a factor of 6.

FIG. 1A is a block diagram that schematically illustrates an Ethernet communication system 10, including a multi-mode Physical Layer (PHY) transceiver 20, in accordance with an embodiment that is described herein. The multi-mode PHY transceiver supports multiple bitrates. In this example, the supported bitrates include 1 Gbps, 2.5 Gbps, 5 Gbps and 10 Gbps. A detailed block diagram of the PHY transceiver is described below with reference to FIG. 1B.

In communication system 10, a host 12 communicates via PHY transceiver and a wired link 30 with a peer PHY transceiver (not shown), e.g., similar to PHY transceiver 20. The host typically communicates with a remote host or other client (not shown) coupled to the other end of the wired link via the peer PHY transceiver. In an embodiment, host 12 comprises a Media Access Controller (MAC) device. In some embodiments, wired link 30 comprises a single twisted-pair copper-based cable. In the context of the present disclosure and in the claims, the wired link is also referred to as a "media interface."

Depending on the actual bitrate selected from among the multiple supported bitrates, the PHY transceiver communicates with the host in accordance with the "GMII" interface (1 Gbps bitrate) or the "XGMII" interface (bitrates higher than 1 Gbps), as specified respectively in Clause 35 and Clause 46 of the IEEE802.3 standard.

In some embodiments, data flow and processing within PHY transceiver 20 is split between Physical Coding Sublayer (PCS) and Physical Media Attachment (PMA) functions, as described herein. In FIG. 1A, PHY transceiver 20 comprises a 1G TX/RX-PCS module 13 that supports a bitrate of 1 Gbps, and a MG TX/RX-PCS module 14 that supports the bitrates 2.5 Gbps, 5 Gbps and 10 Gbps. PHY transceiver 20 additionally comprises a TX/RX-PMA module 16, which handles the PMA functions of the PHY transceiver.

In the transmit direction, the PHY transceiver processes bits received from the host, using the 1G TX/RX-PCS module to produce TX three-level PAM (PAM3) symbols, or the MG TX/RX-PCS module to produce TX eight-level PAM (PAM8) symbols. The TX/RX-PMA module converts the TX symbols into analog signals for transmission over the wired link. In the receive direction, the PHY transceiver processes analog signals received over the wired link using the TX/RX-PMA module to recover RX PAM3 or PAM8 symbols transmitted by the peer PHY transceiver. The 1G TX/RX-PCS module or the MG TX/RX-PCS module recovers RX bits from the respective PAM3 or PAM8 RX symbols, and forwards the recovered RX bits to the host. In an embodiment, the PHY transceiver starts operating in a training mode for link establishment, and moves to a data mode of operation when link with the peer PHY transceiver is established.

PHY transceiver 20 comprises a Forward Error Correction (FEC) module 15. In the transmit direction, the FEC module encodes a frame of TX bits in accordance with the underlying FEC code to generate a code word that includes the TX input bits and redundancy bits. In the receive direction the FEC module receives a code word containing RX bits and redundancy bits (some of the code word bits may be erroneous) and decodes the code word to recover the RX bits.

In the disclosed embodiments, the same FEC module is used among all the bitrates supported, i.e., in the present example, 1 Gbps, 2.5 Gbps, 5 Gbps and 10 Gbps. In some embodiments, 1G TX/RX-PCS module 13 implements the PCS functionality for 1 Gbps in accordance with the 1000BASE-T1 standard, in which case FEC module implements encoding/decoding in accordance with the Reed Solomon (RS) code specified within the 1000BASE-T1 standard. The embodiment design in which the MG TX/RX-PCS module handles the PCS and PAM processing for the 2.5 Gbps, 5 Gbps and 10 Gbps bitrates using the same FEC module specified for the 1 Gbps, results in a very efficient implementation is terms of hardware footprint, power consumption and complexity.

In some embodiments, the PHY transceiver comprises a PCS Reset function, PCS Transmit function, and PCS Receive function. After completion of the Reset function, the PHY transceiver immediately starts running the Transmit and Receive functions simultaneously.

Figure 1B:
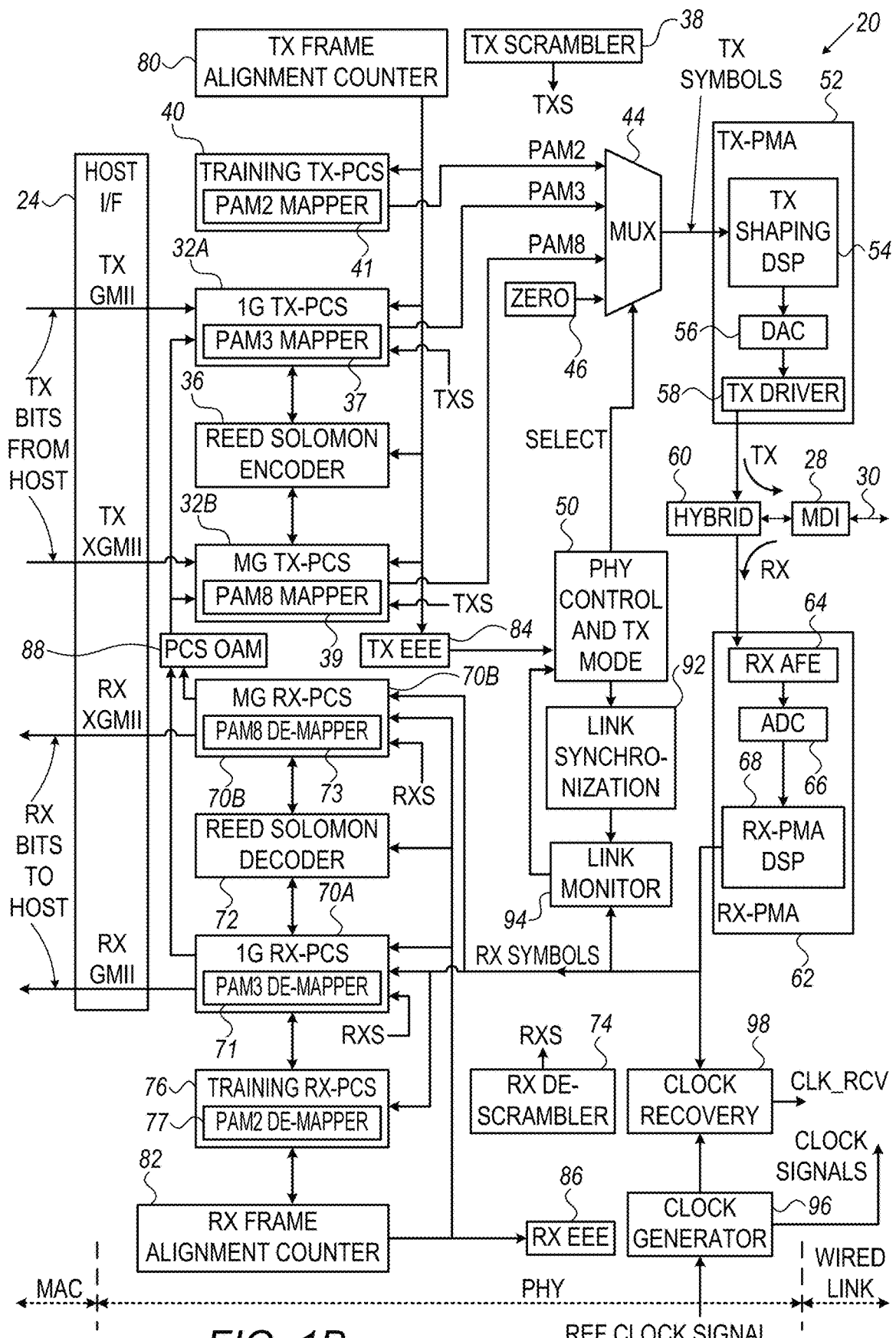
FIG. 1B is a block diagram that schematically illustrates a multi-mode Physical Layer (PHY) transceiver, in accordance with an embodiment that is described herein.

FIG. 1B is a block diagram that schematically illustrates a multi-mode Physical Layer (PHY) transceiver 20, in accordance with an embodiment that is described herein. PHY transceiver 20 provides Ethernet communication over a wired link at multiple predefined bitrates. In the present example, the supported bitrates include 1 Gbps, 2.5 Gbps, 5 Gbps and 10 Gbps. The disclosed embodiments, however, are also applicable, with necessary adaptation, to other suitable bitrates. In addition, any subset of bitrates comprising two or more bitrates among 1 Gbps, 2.5 Gbps, 5 Gbps and 10 Gbps can also be used.

PHY transceiver 20 is suitable, for example, in industrial and/or automotive applications. In an embodiment, PHY transceiver 20 supports communication over a single twisted-pair cable of automotive grade, i.e., up to a distance of about 15 meters. Another relevant application is circuit board backplane communications using a single differential pair.

PHY transceiver 20 employs PCS functions for communicating at a bitrate of 1 Gbps that are specified in the IEEE 802.3 bp-2016 standard cited above, and will be described briefly below. Specifically, PCS transmit and receive functions are described in Clause 97.3 of the IEEE 802.3 bp-2016 (1000BASE-T1) standard. PMA functionality of the PHY transceiver is described in Clause 97.4.

In the transmit direction, PHY transceiver 20 receives from a host, via a host interface 24, TX bits for transmission to a peer PHY transceiver (not shown). The host may reside in the same integrated circuit as the PHY transceiver or in a separate device external to the PHY transceiver integrated circuit. The PHY transceiver processes the TX bits to generate respective TX symbols. The PHY transceiver transmits the TX symbols to the peer PHY transceiver over a wired link via a Medium-dependent Interface (MDI) 28. The MDI provides a physical and electrical interface between the PHY transceiver and wired link 30. In the present example, wired link 30 comprises a single twisted-pair copper-based cable. In an alternative embodiment, wired link 30 comprises a single pair backplane.

In the receive direction, PHY transceiver 20 receives RX symbols from the peer PHY transceiver over wired link 30 via MDI 28. The PHY transceiver processes the received RX symbols for extracting RX bits carried in the RX symbols, and forwards the RX bits to the host via host interface 24.

Host interface 24 couples between PHY transceiver 20 and a higher layer device such as a Media Access Controller (MAC). Host interface 24 supports multiple bitrates for communicating the TX bits the RX bits between the PHY transceiver and the host. As noted above, in the present example, the bitrates of 1 Gbps, 2.5 Gbps, 5 Gbps and 10 Gbps are supported.

In the embodiment of FIG. 1B, host interface 24 comprises a parallel interface that communicates multiple data bits in a single clock cycle. For a 1 Gbps bitrate, the host interface comprises a Gigabit Media-independent Interface or "GMII", which is specified, for example, in Clause 35 of the IEEE802.3 standard. GMII is a byte-wide data link plus control signals, clocked at 125 MHz. For bitrates higher than 1 Gps, the host interface comprises "XGMII", as specified, for example, in Clause 46 of the IEEE802.3 standard. XGMII is a four-byte-wide data link plus control signals, clocked at 312.5 MHz.

In some embodiments, the host interface comprises an additional serial link towards the host (not shown). In such embodiments, for the 1 Gbps bitrate, the serial interface to the host is referred to as "SGMII", clocked at 1.25 GHz. For the 10 Gbps bitrates, the serial interface to the host is referred to as "XFI", clocked at 10.3125 GHz. For the 2.5 Gbps and 5 Gbps bitrates, the IEEE standards "2.5GBASE-KX" and "5GBASE-KR" are used, respectively, in an embodiment. In yet another embodiment, a commonly adopted interface referred to as "USXGMII" is employed, which is a de-facto standard written by Cisco that supports the bitrates 10 Gbps, 5 Gbps, 2.5 Gbps, 1 Gbps, 100 Mbps and 10 Mbps.

PHY transceiver 20 comprises separate Physical Coding Sublayer (PCS) modules coupled to the different host interfaces GMII and XGMII. In the transmit direction, TX bits received from the host via the GMII (1 Gbps) are processed using a 1G TX-PCS module 32A, whereas TX bits received via the XGMII (2.5 Gbps, 5 Gbps and 10 Gbps) are processed using a MG TX-PCS module 32B.

The 1G TX-PCS module (32A) processes the TX bits received via the GMII in accordance with the 1000BASE-T1 standard, which comprises encoding the TX bits using a Reed Solomon (RS) Forward Error Correction (FEC) code using a RS encoder 36, and mapping the encoded bits using a 3PAM mapper 37 into 3-level PAM symbols. The RS-FEC code comprise a RS(450, 406) code that encodes 406 symbols into a code word of 450 symbols as specified in Clause 97 of the IEEE802.3 standard.

The MG TX-PCS module (32B) processes the TX bits received via the XGMII interface in accordance with dedicated framing, encoding and modulation schemes designed for the respective bitrates 2.5 Gbps, 5 Gbps and 10 Gbp. These dedicated schemes are different from the framing, encoding and modulation schemes specified for 1 Gbps in the IEEE802.3 standard. The processing in MG TX-PCS module (32B) comprises encoding the TX bits using RS encoder 36, and mapping the encoded bits into 8-level PAM (denoted PAM8) symbols using a PAM8 mapper 39. Note that in the example embodiment of FIG. 1B, the same RS encoder 36 is used by both the 1G TX-PCS and MG TX-PCS modules, thereby obviating the necessity of a dedicated RS encoder block for both of 1G and MultiGig transmission modes.

Each of the 1G TX-PCS and MG TX-PCS modules provides RS encoder 36 with input frames of 3654 bits in length for encoding. The RS encoder encodes the 3654-bit frames into RS code words of 4050 bits in accordance with the underlying RS-FEC (450, 406) code, and returns the RS code words to the relevant TX-PCS module. The framing, encoding and modulation schemes applied in 1G TX-PCS module 32A and MG TX-PCS module 32B are described in further detail below.

A TX scrambler 38 generates a TX scrambling bit-sequence, denoted TXS. 1G TX-PCS module 32A and MG TX-PCS module 32B use the TXS bit-sequence for scrambling the RS code words in the transmission path. For the 1 Gbps bitrate, a scrambler bit-sequence generator is specified, for example, in Clause 97 of the IEEE802.3 specification. In some embodiments, TX scrambler 38 generates the same scrambling bit-sequence TXS for both 1G TX-PCS module 32A (1 Gbps) and MG TX-PCS module 32B (2.5 Gbps, 5 Gbps and 10 Gbps).

PHY transceiver 20 further comprises a training TX-PCS 40, and a training RX-PCS module 76, which handle link establishment with the peer PHY transceiver. In some embodiments, the same training procedure specified in the IEEE802.3 standard applies to all of the supported bitrates.

In training mode (see, for example, Clause 97.4.2.4 of the IEEE802.3 standard) the training TX-PCS and RX-PCS modules respectively transmit and receive PAM2 training sequences to synchronize to the PHY frame, learn the data mode scrambler seed, and exchanges for Energy Efficient Ethernet (EEE) and 1000BASE-T1 Administration, and Maintenance (OAM) capabilities.

Training TX-PCS 40 comprises a training state machine (not shown) that coordinates link training activity with the peer PHY transceiver. Training TX-PCS transmits a training pattern by mapping a training bit-sequence using a PAM2 mapper 41. In one embodiment, the training bit-sequence is generated internally to the training TX-PCS. In an alternative embodiment, the training bit-sequence is generated by TX scrambler 38, configured to a training mode.

A multiplexer 44 receives as inputs PAM2 symbols from training TX-PCS 40, PAM3 symbols from 1G TX-PCS module 32A, PAM8 symbols from MG TX-PCS module 32B, and a zero input 46. Multiplexer 44 selects one of is inputs using a selection signal provided by a PHY control and TX mode module 50, which will be described below.

A transmit Physical Media Attachment (TX-PMA) module 52 receives PAM2, PAM3 or PMA8 symbols output by multiplexer 44 in a digital form. TX-PMA module 52 processes the symbols and converts them into analog form. TX-PMA module 52 comprises a TX shaping module 54, a Digital to Analog Converter (DAC) 56 and a TX driver 58. The TX shaping module filters the incoming symbols so as to meet a desired frequency spectrum over wired link 30. In some embodiments, the TX shaping module applies different filters to the respective PAM2, PAM3 and PAM8 symbols. DAC 56 converts the filtered symbols into analog signals, which TX driver 58 amplifies for transmission via MDI 28.

In the transmit direction, a hybrid module 60 transfers the analog signals output by TX driver 58 to the wired link via the MDI. In the receive direction, the hybrid module transfers analog signals received over the wired link via the MDI to a RX-PMA module 62. The hybrid module isolates between the transmitted signal and the received signal.

RX-PMA module 62 comprises a RX Analog Front End (AFE) 64, an Analog to Digital Converter (ADC) 66 and a RX-PMA DSP module 68. RX AFE 64 applies to the received signals various analog functions such as amplification and filtering, for achieving the desired receive signal properties. ADC 66 samples and converts the continuous-time analog signals output by the RX AFE module into digital samples. RX-PMA DSP module 68 performs various digital signal processing operations to the digital samples, such as equalization and echo cancellation, for achieving the desired receive signal properties. The echo cancelation function eliminates or reduces significantly leaking and/or reflected transmit signals present in the reception path.

The RX-PMA module outputs PAM3 or PAM8 symbols in data mode, and PAM2 symbols in training mode. The output of the RX-PMA module is routed to a 1G RX-PCS module 70A, to a MG RX-PCS module 70B and to training RX-PCS module 76, for extracting the RX bits carried in the RX symbols.

The 1G RX-PCS module (70A) processes the PAM3 RX symbols received from RX-PMA module 62 in accordance with the 1000BASE-T1 standard, by de-mapping the PAM3 symbols to respective 3-bit units using PAM3 de-mapper 71 in accordance with the 3-Bit to 2-Ternary (3B2T) mapping, and decoding the de-mapped bits in accordance with the RS-FEC (450, 406) code using a RS decoder 72. The PHY transceiver transmits the RX bits recovered by the 1G RX-PCS module to the host via the RX GMII interface.

The MG RX-PCS module (70B) processes the received PAM8 RX symbols in accordance with dedicated framing, decoding and de-modulation schemes designed for the respective bitrates 2.5 Gbps, 5 Gbps and 10 Gbp. The dedicated schemes are different from the framing, de-modulation and decoding schemes specified for 1 Gbps in the 1000BASE-T1 standard. The processing in MG RX-PCS module 70B includes de-mapping of the PAM8 symbols into 3-bit units using a PAM8 de-mapper 73, and decoding the de-mapped bits in accordance with the RS-FEC (450, 406) code using the same RS decoder 72 used for the 1 Gbps bitrate. The PHY transceiver transmits the RX bits recovered by the MG RX-PCS module to the host via the RX XGMII interface.

Each of 1G RX-PCS module 70A and MG RX-PCS 70B, input to RS decoder 72 RS code words of 4050 bits. The RS decoder decodes the RS code words into respective frames of 3654 bits in accordance with the RS-FEC (450, 406) code and returns the 3654-bit frames to the relevant RX-PCS module. The framing, decoding and de-modulation schemes applied in 1G RX-PCS module 70A and MG RX-PCS module 70B are described in further detail below.

A RX de-scrambler 74 generates a RX de-scrambling bit-sequence, denoted RXS, which 1G RX-PCS module and MG RX-PCS module use for de-scrambling the bits of the RS code words. For the 1G RX-PCS module, a de-scrambler bit-sequence generator is specified in Clause 97 of the IEEE802.3 standard. In some embodiments, RX de-scrambler 74 generates the same de-scrambling bit-sequence for both the 1G RX-PCS and the MG RX-PCS modules.

Training RX-PCS 76 in the PHY transceiver handles link establishment with the peer PHY transceiver. Training RX-PCS 76 receives from RX-PMA module 62 PAM2 symbols, and de-maps the PAM2 symbols into bits using a PAM2 de-mapper 77.

PHY transceiver 20 comprises a TX frame alignment counter 80, which provides for training mode (PAM2 symbols) and data mode (PAM3 or PAM8 symbols) a common timing alignment indication of the start of a 2700 symbol frame, also referred to as a "PHY frame." In some embodiments, the alignment indication comprises a zero value of the TX frame alignment counter. The boundary of the PHY frame is indicated during training so that the link partners acquire frame alignment prior to switching to data mode. A RX Frame alignment counter 82 keeps track of the frame alignment in the RX-PCS modules for all PCS modes, i.e., PAM2 in training mode, and PAM3 or PAM8 in data mode.

In the example of FIG. 1B, PHY transceiver 20 supports Energy Efficient Ethernet (EEE) capabilities, i.e., the ability to enter a Low Power Idle (LPI) mode of operation in periods during which no data is available for transmission over the wired link and/or no data is being received from the wired link.

The PHY transceiver comprises a TX EEE 84 module, implementing a state machine that controls the precise timing of the "quiet" and "refresh" cycles that take place during EEE LPI mode. TX EEE module 84 controls the operation of various elements of the PHY transceiver, by setting these elements to a low power mode of operation, and by causing adaptive Digital Signal Processing (DSP) functions to freeze adaptation during transmit periods of "quiet" and resume adaptation during periods of transmit "refresh". For example, TX EEE module 84 controls echo canceller DSP adaptation in the RX-PMA DSP. The TX EEE functionality depends on the actual bitrate. For example, timers used by the TX EEE module are based on bitrate and therefore these timers scale as the baud rate changes from 1G up to 2.5/5/10 Gbps.

The PHY transceiver additionally comprises a RX EEE 86 module, implementing a state machine that controls the operation of various elements of the PHY transceiver, by setting these elements to a low power mode of operation, and causing adaptive DSP functions to freeze adaptation during periods of receive "quiet" and resume adaptation during periods of receive "refresh". Adaptive DSP functions controlled by the EX EEE module include, for example, Feed-Forward Equalization (FFE), Decision Feedback Equalization (DFE) and timing recovery DSP adaptation. The RX EEE functionality depends on the actual bitrate. For example, timers used by the RX EEE module are based on bitrate and therefore these timers scale as the baud rate changes from 1G up to 2.5/5/10 Gbps.

Clause 97 of the IEEE 802.3 specification defines for the 1 Gbps bitrate (1000BASE-T1) a PCS level Operations, Administration, and Maintenance (OAM) protocol, which provides an optional mechanism for monitoring link operation, such as exchanging PHY link health status and message exchange.

In some embodiments, the 1000BASE-T1 OAM information is exchanged in-band between two PHY transceivers using excess bandwidth available on the wired link. The 1000BASE-T1 OAM is strictly between two 1000BASE-T1 PHYs on the physical layer and their associated management entities, if present. In FIG. 1B, a PCS OAM module 88 implements an OAM state machine that manages OAM message construction, message passing, message receiving and message acknowledgement between the local PCS functions and the link partner PCS functions.

PHY control and TX mode module 50 comprises a state machine that manages the various modes of operation of the PHY transceiver, and the sequence of operations necessary to progress through the link training states and into data mode during link establishment. The PHY control and TX mode module receives link status indication from a link monitor 94, which determines the status of the underlying receive channel. The state machine of PHY control and TX mode module 50 selects internal states in response to the link status indication.

In some embodiments, PHY transceiver 20 is configured as a master PHY or as a slave PHY. The peer PHY transceiver in thus configured to the opposite role of master or slave PHY. A link synchronization module 92 synchronizes between the master PHY and the slave PHY before training starts. The link synchronization module provides a fast and reliable mechanism for the link partner to detect the presence of the other, validate link, and start timers (not shown) used by link monitor 94.

PHY transceiver 20 comprises a clock generator 96 that generate one or more clock signals required for clocking the various elements of the PHY transceiver. The clock generator is driven by a reference clock signal. In an embodiment, the reference clock is configured to one or the frequencies 25 MHz, 50 MHz, and 156.25 MHz.

When the PHY transceiver is configured to a 1 Gbps bitrate mode, the main clock signal for TX-PMA module 52 and RX-PMA module 62 comprises a 750 MHz clock signal. When the PHY transceiver is configured to a 2.5 Gbps bitrate mode, the main clock signal depends on implementation. In one embodiment, the 2.5 Gps main clock signal runs at 937.5 MHz. For 5 Gbps and 10 Gbps bitrate modes, the clock generator generates the main clock signal for the TX-PMA and RX-PMA modules as a respective multiplicative factor of 2× and 4×, relative to the main clock signal of the 2.5 Gbps clock signal.

PHY transceiver 20 comprises a clock recovery module 98, which is driven by clock generator 96, and additionally receives the symbols output by RX-PMA module 62. When the PHY transceiver operates as a master PHY, the clock recovery module generates a clock signal whose phase is adjusted to match the optimal sampling phase of the signal arriving at the MDI and the clock signal drives ADC 66. DAC 56 is driven by the PHY main clock. When the PHY transceiver operates as a slave PHY, clock recovery module 98 recovers the clock from the received signal (i.e., output by the RX-PMA) and the PHY transceiver uses the recovered clock signal to determine the timing of various transmission operations. In this case, the clock recovery module generates a clock signal whose phase and frequency are adjusted to match the incoming signal, and the recovered clock signal drives ADC 66, DAC 56, and the blocks in the TX-PCS, TX-PMA, RX-PMA and RX-PCS modules.

In some embodiments, the PHY transceiver determines the actual operative bitrate to be used by performing auto-negotiation with the link partner. Based on the selected bitrate, the PHY transceiver activates one of the 1G TX-PCS and MG TX-PCS modules in the transmission direction, and one of the 1G RX-PCS and MG RX-PCS modules in the reception direction. In an alternative embodiment, the PHY transceiver selects the operative bitrate as a default configuration. In some embodiments, the PHY transceiver performs auto-negotiation using a hardware state machine, firmware running on an embedded processor or in combination of hardware and software. In an example embodiment, determination of the operative bitrate is implemented within PHY control and TX mode module 50.

The configurations of Ethernet communication network 10 of FIG. 1A and PHY transceiver of FIG. 1B are given by way of example, and other Ethernet communication network and PHY transceiver configurations can be used.

In some embodiments, some or all of the elements of PHY transceiver 20, such as 1G TX/RX-PCS 13, MG TX/RX-PCS 14, FEC module 15 and TX/RX-PMA module of FIG. 1A, as well as 1G TX-PCS 32A, 1G RX-PCS 70A TX-PMA 52, training TX-PCS 40, MG TX-PCS 32B, MG RX-PCS 70B, RX-PMA 62, training RX-PCS 76, RS encoder 36, RS decoder 72, PHY control and TX mode module 50, link synchronization and link monitor 94 of FIG. 1B, are implemented in hardware, such as using one or more Field-Programmable Gate Arrays (FPGAs) or Application-Specific Integrated Circuits (ASICs). In an alternative embodiment, certain elements such as one or more of the PCS and PMA modules FIGS. 1A and 1B, the FEC module 15 in FIG. 1A and RS encoder 36 and RS decoder 72 in FIG. 1B and/or PHY control and TX mode module 50 in FIG. 1B, are implemented in a programmable processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory. The elements of PHY transceiver 20 excluding host interface 24 are referred to herein and in the claims as "mapper/modulator."

The architecture of PHY transceiver 20 described herein achieves various desirable outcomes:

The same RS-FEC (450, 406) code specified for the 1000BASE-T1 standard is also used for the supported bitrates higher than 1 Gbps. Such reuse is possible because the same frame length is used at the RS encoder input and at the RS decoder output for all of the supported bitrates. This allows the PHY transceiver to reuse the same physical RS encoder and RS decoder used in 1 Gbps, also for each of the bitrates higher than 1 Gbps.

The RS-FEC (450, 406) code is based upon 9-bit RS symbols, which aligns to the 3-bit symbol mapping used in the 1000BASE-T1 standard. Note that each 9-bit RS symbol comprises a sequence of 9 consecutive bits, which is an integer multiple of the 3-bit symbols, thus ensuring the alignment. Reuse of the same RS encoder and RS decoder modules for the bitrates higher than 1 Gbps reduces the size, cost and power dissipation of PHY transceiver 20.

In PHY transceiver 20, the PAM2-based link training signaling, message exchange mechanism and boundary alignment and sequencing that are defined for 1 Gbps in the 1000BASE-T1 standard are also used for bitrates higher 1 Gbps. Therefore, link training for 2.5 Gbps, 5 Gbps and 10 Gbps takes only about 100 ms (i.e., same as in the 1 Gbps training.) In some embodiments, as outlined in the IEEE standard 802.3 bp Clause 97, a PAM2 training pattern is generated by taking binary values from a 33-bit linear feedback shift register at 750 Mbaud. The master and slave PHYs use different LSFR feedback taps to eliminate correlation in the sequence. In addition, a partial frame alignment indicator is embedded in the training pattern by flipping the polarity of the PAM2 every 180 cycles. The final 96 bits of the 2700 PAM2 symbol frame is replaced with and handshaking message referred to as "InfoField." For 2.5 Gbps link training, the baud rate is increased to achieve the desired bit rate in data mode, for the preferred embodiment the baud rate is increased from 750 Mbaud to 937.5 Mbaud and the 2700 PAM2 symbol framing indication sets the boundary that comprises two frames of PAM8 data with 1350 symbols each. In this manner, the link training state machines defined in 802.3 bp Clause 97 are reused for the PAM8 multi-Gig link training, in an embodiment. Reusing the PAM2-based training in bitrate modes higher than 1 Gbps simplifies the overall implementation, reduces development costs, and improves interoperability among PHY transceiver vendors.

For bitrates higher than 1 Gbps, PHY transceiver 20 employs a 3-bit PAM8 symbol mapping instead of the 3B2T symbol mapping specified for 1 Gbps in the 1000BASE-T1 standard. The 3-bit symbol mapping aligns to the 9-bit RS symbols of the RS-FEC (450, 406) code, therefore avoiding increase in the system bit error rate due to possible misalignment.

By mapping each 3-bit unit of the RS code words into a single PAM8 symbol, the transmission bitrate is doubled for a given baud rate, compared to the 3B2T mapping used for 1 GBps. This doubles the 1 Gbps bitrate to a 2 Gbps bitrate. The number of symbols transmitted per RS-FEC block (e.g., PHY frame) reduces from 2700 in 1 Gbps configuration to 1350 in bitrates higher than 1 Gbps. During 1000BASE-T1 link training, the boundary of a 2700-symbol RS-FEC block is determined from a PAM2 training pattern embedded with indicators for the 15 180-symbol partial PHY frames that comprise the RS-FEC block. In one embodiment, the PHY transceiver uses the 2700-symbol boundary that contains two blocks of 1350 PAM8 symbols, thus retaining for bitrates higher than 1 Gbps, the same link training structure and functions specified for 1 Gbps in the 1000BASE-T1 standard. In another embodiment, the PHY transceiver uses a reduced size training frame boundary that matches the 1350-symbol boundary of the RS-FEC block in the MG TX-PCS module.

Now we describe in brief PCS and PMA functionalities of the PHY transceiver, specified in the 1000BASE-T1 standard.

In accordance with the IEEE 802.3 specification, the 1000BASE-T1 PHY transceiver transmits 3-level PAM (PAM3) symbols at 750 MBaud. A 15-bit scrambler is used to improve the Electromagnetic Compatibility (EMC) performance. The 15-bit scrambler is comprised of a 15-bit Linear Feedback Shift Register (LFSR) that produces a pseudo-random sequence of length ($2^{15}-1$). This sequence is then bitwise XOR'd with the data sequence to randomize the data on the transmit side, but can be perfectly reversed at the receiver producing the desired data. The scrambler ensures that the transmit data is random and has no spectral content that would cause a failure in EMC compliance tests due to individual radiated frequencies above the allowed limits. Over the byte-wide GMII, data TX D and control signals TX EN and TX ER, are encoded using a 80B/81B encoding scheme that encodes each input unit of 80 bits into an encoded unit of 81 bits, so that 10 cycles (i.e., 8 bit·10 cycles=80 bits) of GMII data and/or control are encoded into an 81-bit unit, to reduce the overhead. To maintain a Bit Error Ratio (BER) of less than or equal to $10^{-10}$, the 1000BASE-T1 PHY adds 396 redundancy bits, generated by a Reed Solomon (RS)—Forward Error Correction (FEC), to each group of 45 80B/81B-encoded blocks (containing 450 octets of GMII data). The functions of PAM3 mapping, scrambling, RS-FEC, and 80B/81B encoding/decoding are part of the PCS functionality (see Clause 97.3 of the IEEE 802.3 specification.)

The 1000BASE-T1 PMA couples messages from the PCS to the MDI and implements functions such as clock recovery, link management and PHY Control. The PMA provides full duplex communications at 750 MBaud over the single twisted-pair copper cable. PMA functionality for 1000BASE-T1 is described in Clause 97.4 of the IEEE 802.3 specification.

The 1000BASE-T1 PCS couples a Gigabit Media Independent Interface (GMII), as described in Clause 35, to a Physical Medium Attachment (PMA) sublayer, described in Clause 97.4, which supports communication over a single twisted-pair copper cable.

Next we describe PCS data flow within the PHY transceiver.

Figure 2:
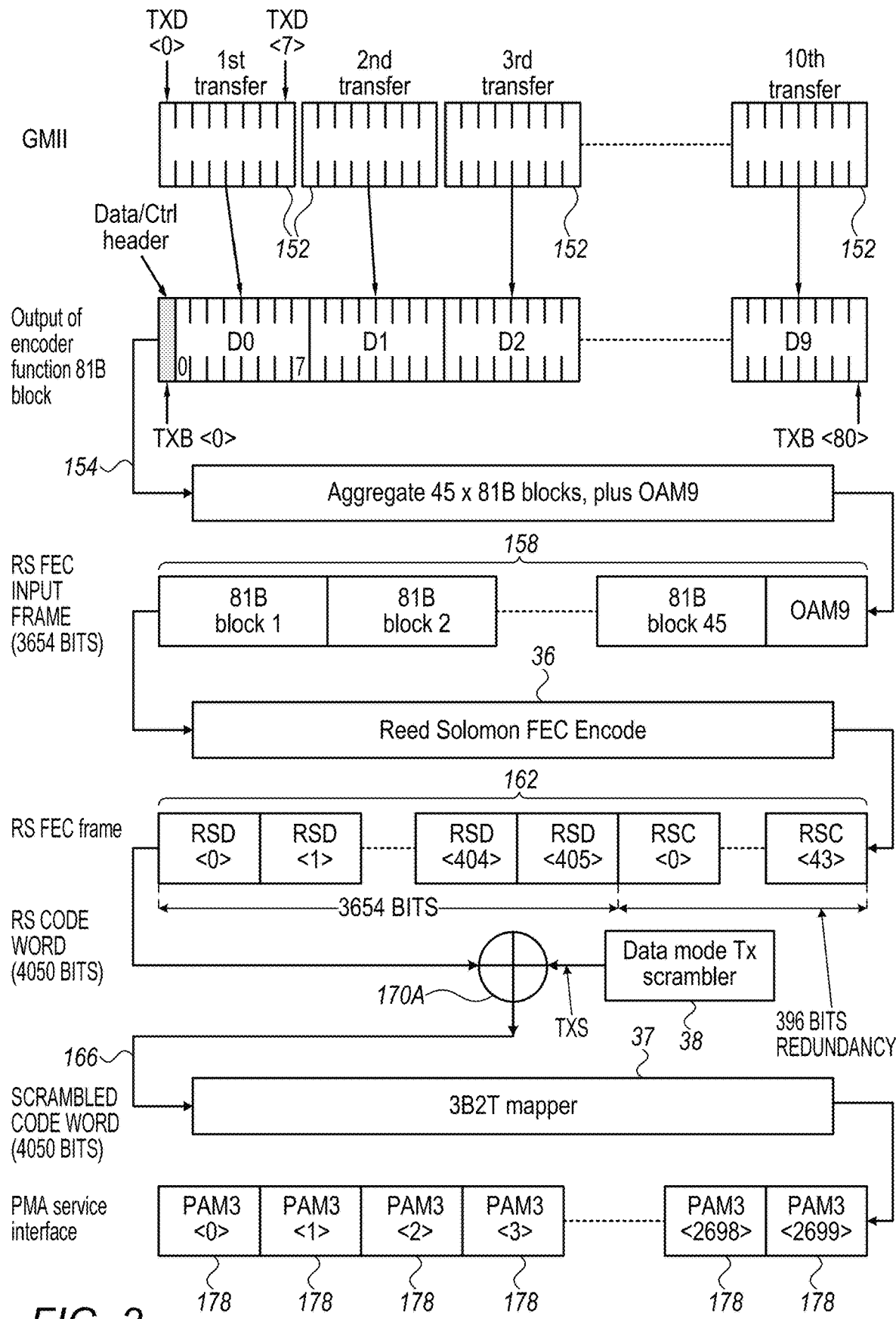
FIGS. 2 and 3 are diagrams that schematically illustrate Physical Coding Sublayer (PCS) transmission and reception data flows, in PHY transceiver 20 configured to operate at 1 Gbps bitrate, in accordance with an embodiment that is described herein.
Figure 3:
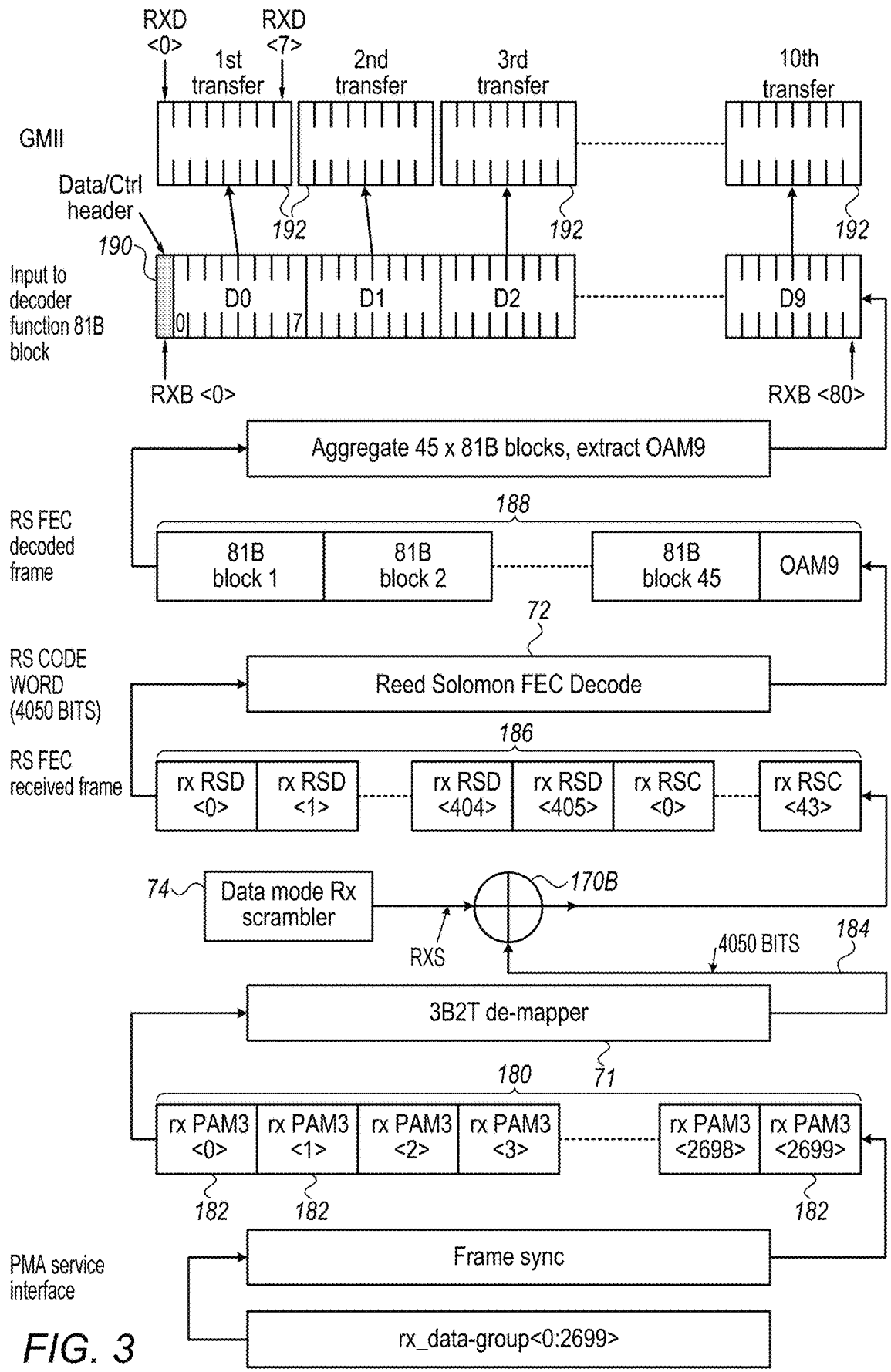

FIGS. 2 and 3 are diagrams that schematically illustrate Physical Coding Sublayer (PCS) transmission and reception data flows, in PHY transceiver configured to operate at a 1 Gbps bitrate, in accordance with an embodiment that is described herein. FIGS. 2 and 3 incorporate several functional blocks of FIG. 1 such as RS encoder 36, TX scrambler 38, RS decoder 72 and RX de-scrambler 74. The data flows in FIGS. 2 and 3 are specified in the 1000BASE-T1 standard, and are implemented respectively within 1G TX-PCS module 32A and 1G RX-PCS module 70A of the PHY transceiver.

1G TX-PCS module 32A is coupled to the GMII interface, which provides data TXD and control signals TX EN and TX ER, to the 1G TX-PCS module at 8 nanoseconds intervals, clocked by a GTX CLK (not shown). 1G TX-PCS module 32A encodes bytes 152 received via the GMII over ten GTX CLK cycles, using an 80B/81B encoder that encodes every possible combination of data and control. Encoding schemes suitable for implementing the 80B/81B encoder are described, for example, in U.S. Pat. No. 9,749, 237. The control signals enable the mapping of TXD to control symbols for transmit error propagation, receive error, assert low power idle, and inter-frame signaling, as defined in Clause 35.2.1.6 of the IEEE802.3 standard. For each group of 10 input bytes, the 80B/81B encoder outputs an 81-bit block 154 that comprises 10 bytes denoted D0 . . . D9 and a Data/Control header bit. An 80B/81B encoding scheme is specified, for example in Clause 97.3.2.2 of the IEEE802.3 standard.

1G TX-PCS module 32A aggregates 45 81-bit blocks generated by the 80B/81B encoder, and an additional 9 bits of 1000BASE-T1 OAM data (see Clause 97.3.8 of the IEEE802.3 standard) into a 3654-bit frame 158, and provides frame 158 to RS encoder 36 as input. The RS encoder adds 396 redundancy bits to the 3654 input bits, resulting in a RS code word 162 having 3654+396=4050 bits. The RS code word comprises 9-bit RS symbols denoted RSD (data) and RSC (redundancy). RS code word 162 is also referred to interchangeably as a "PHY frame" or "RS FEC frame."

The 1G TX-PCS module scrambles the bits of the RS code word with a scrambling bit-sequence TXS, resulting in a scrambled code word 166 having 4050 bits. The scrambling bit-sequence TXS is generated by TX scrambler 38 (operating as a 15-bit side-stream scrambler) configured to data mode. A XOR module 170A performs the scrambling operation by calculating bitwise XOR between TXS and the RS code word, e.g., in units of 15 bits.

A 3B2T mapper, i.e., 3PAM mapper 37 of FIG. 1B, maps each 3-bit unit of scrambled code word 166 into two PAM3 symbols. The PAM3 mapper thus generates for the 4050 bits in the scrambled code word a frame of 2700 PAM3 symbols 178. The PAM3 mapper passes the PAM3 symbols to TX-PMA module 52 via multiplexer 44.

In data mode, the data path in the 1G RX-PCS module operates in the opposite order as the transmit path of the 1G TX-PCS module described with reference to FIG. 2.

1G RX-PCS module 70A receives PAM3 symbols from RX-PMA module 62. The 1G RX-PCS module synchronizes the incoming PAM3 symbols to boundaries of a PHY frame 180 using RX frame alignment counter 82. The synchronized frame contains 2700 PAM3 symbols 182.

PAM3 de-mapper 71 de-maps each pair of PAM3 symbols in the synchronized frame into a 3-bit unit. Overall, the PAM3 de-mapper de-maps 2700 PAM3 symbols into a scrambled frame 184 that comprises a 4050-bit scrambled code word. RX de-scrambler 74 generates a de-scrambling bit-sequence denoted RXS. 1G RX-PCS module de-scrambles the 4050-bit scrambled code word (184) by calculating a bitwise XORing between the scrambled code word and the RXS bit sequence using a bitwise XOR module 170B, resulting in a 4050-bit RS code word 186.

RS decoder 72 decodes code word 186, in accordance with the underlying RS-FEC code, for data validation and correction. The RS decoder outputs a 3654-bit decoded frame 188 that comprises 45 81-bit blocks 190 plus a 9-bit OAM9 field. Each of the 81-bit blocks (190) comprises a Data/Control header bit and 10 bytes denoted D0 . . . D9. The 1G RX-PCS module decodes each 81-bit block 190 using an 80B/81B decoder, resulting in a group of 10 data or control bytes 192. 1G RX-PCS module 70A transfers decoded bytes 192 to the host via the GMII of the host interface.

Figure 4:
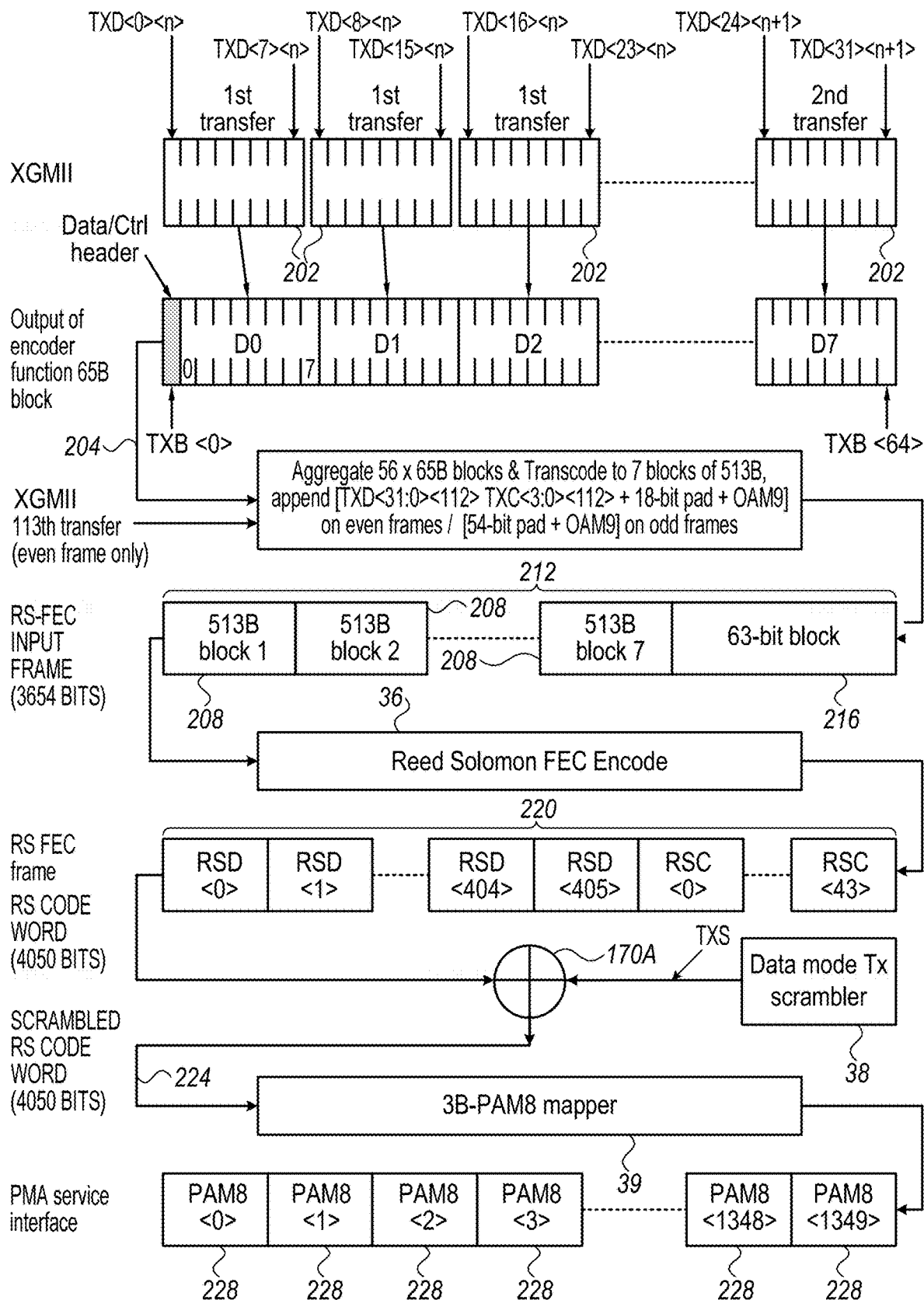
FIGS. 4 and 5 are diagrams that schematically illustrate PCS transmission and reception data flows, in PHY transceiver 20 configured to operate at a bitrate higher than 1 Gbps, in accordance with an embodiment that is described herein.
Figure 5:
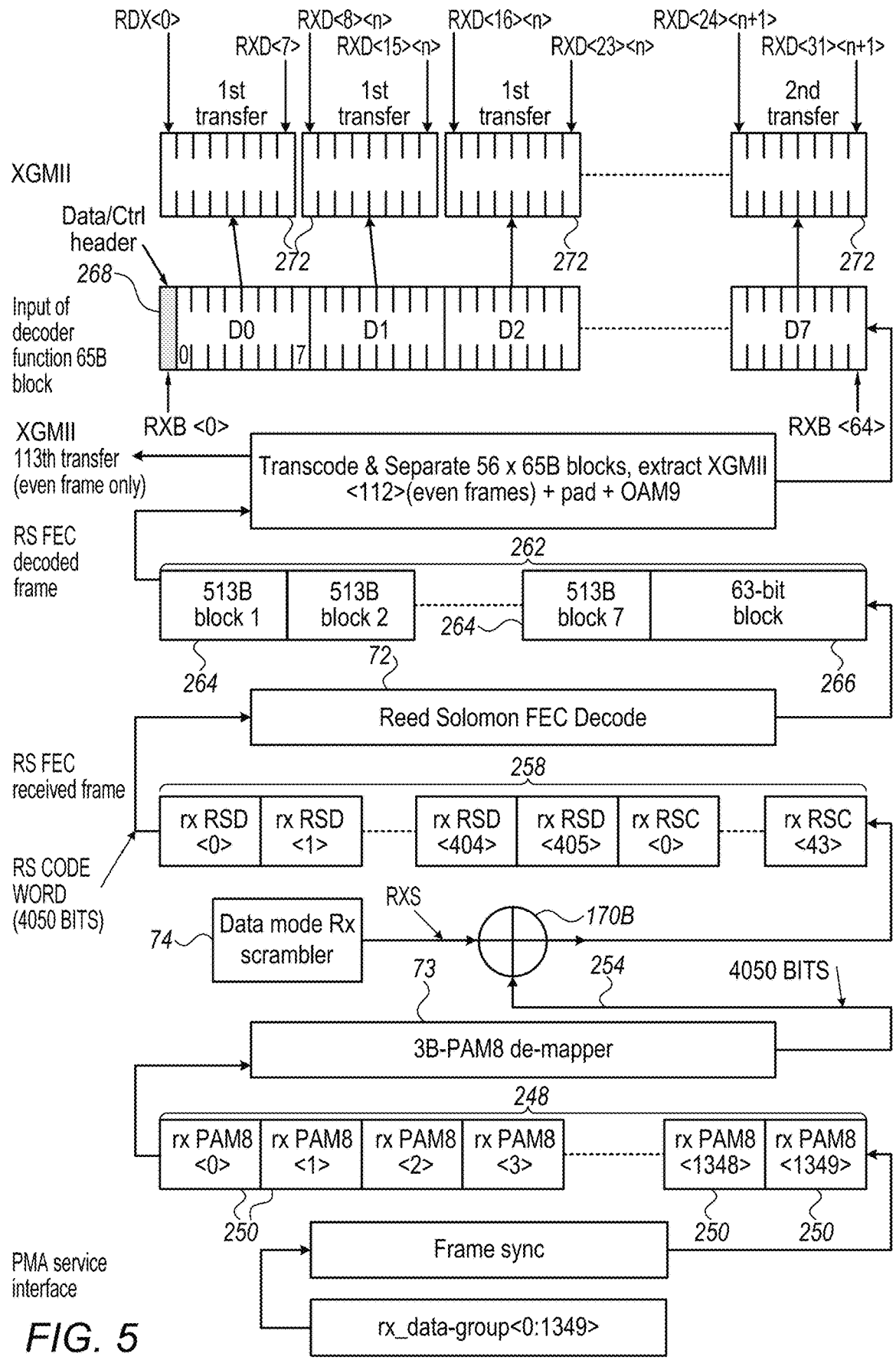

FIGS. 4 and 5 are diagrams that schematically illustrate PCS transmission and reception data flows, in PHY transceiver 20 configured to operate at a bitrate higher than 1 Gbps, in accordance with an embodiment that is described herein. The data flows in FIGS. 4 and 5 are implemented respectively within MG TX-PCS module 32B and MG-PCS module 70B of the PHY transceiver.

MG TX-PCS module 32B communicates with the host over the Ten Gigabit Media Independent Interface (XGMII), which is a 4-byte wide data plus control signals interface. The MG TX-PCS module receives data and control information via the XGMII as bytes 202. In FIG. 4, eight bytes 202 are received via the XGMII in two transfer cycles of four bytes per cycle.

In the present example, MG TX-PCS module 32B encodes the received bytes in two levels, as described herein. The MG TX-PCS module first encodes the eight bytes (64 bits) using a 64B/65B encoder into a 65-bit word 204. A 64B/65B encoding scheme is specified, for example, in Clause 55 of the IEEE 802.3 specification. 64B/65B coding schemes are also described, for example, in U.S. Pat. Nos. 7,809,021 and 9,451,057.

The MG TX-PCS module further encodes each group of eight such 65-bit words 204 (520 bits) into a single 513-bit block 208 using a 512B/513B transcoder. In some embodiments, the 512B/513B transcoder is implemented as specified for 25GBASE-T in Clause 113 of the IEEE 802.3bq specification. The MG TX-PCS module groups seven 513-bit blocks 208 (7.513=3591 bits) plus a 63-bit extension part 216 into a RS FEC input frame 212 having a length of 3654 bits.

The MG TX-PCS module can use the 63 bits of extension part 216 in various ways. For example, in some embodiments, the MG TX-PCS module processes even-indexed and odd indexed RS-FEC input frames differently. In such embodiments, for even-indexed RS-FEC input frames, the MG TX-PCS module appends to the seven 513-bit blocks 36 bits received from the XGMII in a subsequent transfer cycle (4 bytes+4 control bits), leaving 63−36=27 bits for the a 9-bit OAM9 field plus 18 pad bits. For odd-indexed frames, the MG TX-PCS module does not append any data to the seven 513-bit blocks, and fills the 63-bit extension part with the OAM9 field and 54 pad bits. In an embodiment, the 18 and 54 pad bits, corresponding to the even and odd frames, respectively, are used for purposes such as transferring additional OAM bits and/or vendor proprietary purposes. Alternatively or additionally, the MG TX-PCS module calculates a Cyclic Redundancy Check (CRC) code over at least part of the RS-FEC input frame, and sets the CRC code within the pad bits. The CRC code bits provide additional error detection capability.

MG TX-PSC module 32B encodes a RS FEC input frame 212 using the same RS encoder (36) of FIG. 2, to produce a RS code word 220 having 4050 bits. The MG TX-PCS module scrambles RS code word 220 by applying a bitwise XOR operation between code word 220 and a scrambling bit-sequence (TXS) generated using TX scrambler 38, resulting in a scrambled code word 224. The bitwise XOR operation is carried out using XOR module 170A.

PAM8 mapper 39 of the MG TX-PCS module maps 3-bit units of scrambled code word 224 into respective PAM8 symbols 228 having 8 PAM levels. In FIG. 4, the MG TX-PCS module maps a total number of 4050 bits of the scrambled code word into 1350 (4050/3) PAM8 symbols. Note that the RS code word length of 4050 bits is the same for the 1 Gbps and the 2.5 Gbps, 5 Gbps and 10 Gbps bitrates. Also, 4050 is divisible by 3, which is suitable for 3-bit to PAM 8 mapping.

FIG. 5 depicts the receive data flow implemented in MG RX-PCS module 70B. In data mode, the data path in the MG RX-PCS module operates in the opposite order as the transmit path of the MG TX-PCS module described with reference to FIG. 4.

MG RX-PCS module 70B receives PAM8 symbols from RX-PMA module 62. The MG RX-PCS module synchronizes the incoming PAM8 symbols to a PHY frame (248) boundaries using RX frame alignment counter 82. The synchronized frame contains 1350 PAM8 symbols (250) that carry together 1350.3=4050 bits. In an embodiment, it is guaranteed that the PHY/FEC frame contains 1350 symbols and 4050 bits. There is a separate notion that refers to an "Ethernet frame" having a variable number of bytes. One task of the TX PCS block encoding is to convert Ethernet frames and inter-frame gaps into a constant stream of bits that comprise a PHY frame.

A PAM8 de-mapper 73 de-maps each PAM8 symbol 250 in the PHY frame into a respective 3-bit unit. Overall, the MG RX-PCS module converts a number 1350 of PAM8 symbols, using the PAM8 de-mapper, into a scrambled code word 254 having 4050 bits. RX de-scrambler 74 generates a de-scrambling bit-sequence denoted RXS, which the MG RX-PCS module uses for de-scrambling the scrambled code word using a bitwise XOR module 170B, resulting in a RS code word 258. RS decoder 72 decodes RS code word 258 for data validation and correction. The RS decoder outputs a 3654-bit frame 262 that comprises seven 513-bit blocks 264 and a 63-bit extension part 266. The 63-bit extension part comprises 36 bits to be sent to the host in even frames, and a 9-bit OAM9 plus pad bits in both even and odd frames.

The MG RX-PCS transcodes the 3654-bit frame (262) to recover 56 65-bit blocks 268, extracts the 36 bits in even frames, and the 9-bit OAM9 field and pad bits in even and odd frames. Each of the 65-bit blocks (268) comprises a Data/Control header bit and 8 bytes denoted D0 . . . D7. The MG RX-PCS module decodes each 65-bit block using a 64B/65B decoder, resulting in eight decoded bytes 272. The MG RX-PCS module transfers decoded bytes 272 to the host via the XGMII of the host interface.

In FIGS. 4 and 5, two RS FEC input frames contain 7+7=14 513-bit blocks plus 32 data bits (in the even frames). Therefore, the PHY transceiver transmits 14·513+32=7200 bits of data payload per two RS code words that are mapped into 2700 PAM8 symbols. The block size of the combined odd and even RS FEC frames align exactly with size (2700 symbols) of the 1000BASE-T1 RS-FEC block, and with the alignment indicators provided during the PAM2 link training pattern. As noted above, in some embodiments, the 1000BASE-T1 RS-FEC block (PHY frame) contains 2700 symbols and the frame boundaries are indicated during link training. In an embodiment, the same boundaries are indicated for a multi-Gig PHY but the block encompasses two PHY frames, each with 1350 symbols and 4050 bits.

To achieve a 2.5 Gbps bitrate, the baud rate of the PAM8 symbols is set to 937.5 Mbaud, i.e., a 25% increase compared to the 750 Mbaud used for 1 Gbps in the 1000BASE-T1 standard. It is important to note that a frequency of 937.5 MHz is a convenient multiple of the frequencies 25 MHz and 156.25 MHz of the reference clock frequencies commonly used in Ethernet PHYs. In an embodiment, clock generator 96 generates the 937.5 Mbaud clock by multiplying a 25 MHz reference signal by a factor of 75/2. In another embodiment, clock generator 96 generates the 937.5 Mbaud clock by multiplying a 156.25 MHz reference clock signal by a factor of 6. In some embodiments, clock generator 96 generates a clock signal for the 5 Gbps and 10 Gbps bitrates by scaling the 937.5 Mbaud frequency suitable for the 2.5 Gbps as noted above, by a factor of 2 and 4, respectively.

In PHY transceiver 20 (e.g., in clock generator 96) clocks are multiplied using a phase locked loop. In some embodiments, an oscillator tuned to operate at a frequency close to the desired frequency (937.5) is driven by means of control (voltage, current or digital input) to exactly match the desired frequency. The control signal is derived by comparing the difference between the oscillator output divided by an integer N and the reference clock divided by an integer M. In this embodiment, the reference clock is multiplied by a factor of N/M.

Figure 6:
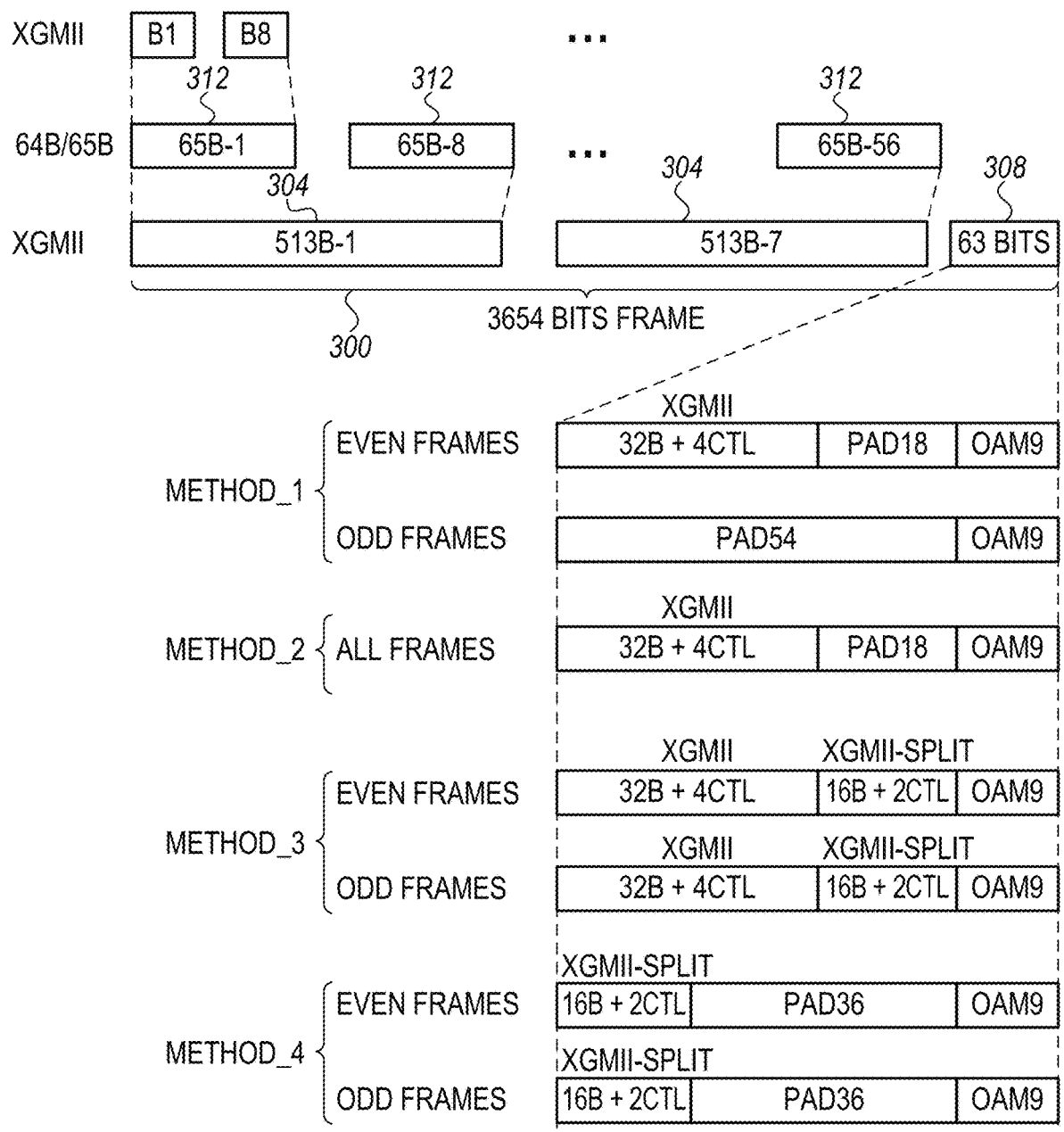
FIG. 6 is a diagram that schematically illustrates several PCS encoding and framing schemes applicable at bitrates higher than 1 Gbps, in accordance with embodiments that are described herein.

FIG. 6 is a diagram that schematically illustrates several PCS encoding and framing schemes applicable at bitrates higher than 1 Gbps, in accordance with embodiments that are described herein.

FIG. 6 depicts a 3654-bit frame 300, which serves in the transmit direction as an input frame to RS encoder 36. As described with reference to FIG. 4 above, frame 300 comprises seven 513-bit blocks 304 (denoted 513B-1 . . . 513B-7) and a 63-bit extension part 308. As described above, the MG TX-PCS module generates each 513-bit block 304 by transcoding a frame of eight 65-bit blocks 312 (denoted 65B-1 . . . 65B-56), and each 65-bit block by encoding eight bytes received over the XGMII using a 64B/65B encoder.

The MG TX-PCS module can use extension part 308 in various ways as described herein. In one embodiment, as described above with reference to FIG. 4, the content of 63-bit extension part 308 differs between even and odd RS FEC frames.

In an embodiment denoted METHOD_1, in even frames the extension part comprises a 36-bit XGMII field comprising 32 data bits and 4 control bits received over the XGMII, a PAD18 field comprising 18 pad bits, and a OAM9 field comprising a 9-bit OAM9 field. In odd frames, 63-bit extension part 308 comprises a PAD54 field of 54 pad bits, and an OAM9 field.

In some embodiments, a 33-bit block code is constructed to reduce the overhead of the last XGMII block from 4 bits to one bit leaving additional pad bits. In some embodiments, the 33-bit block code is based on the 64B/65B block code described above.

In general, the transmission baud rate required is a function of (i) the selected bitrate, (ii) the ratio between the net number of payload bits input to the RS-FEC input and the number of bits in the resulting code word, and (iii) the number of bits per symbol in accordance with the underlying mapping used. For example, in the 1000BASE-T1 standard, the RS encoder encodes 3600 payload bits into a 4050-bit code word, and the 3B2T mapping results in 1.5 bits per symbol, on average. Therefore, for the 1000BASE-T1 standard the baud rate required is given by 1 Gbps·(4050/3600)/1.5=750 Mbaud. Similar calculations apply for determining the required baud rate for the other framing schemes and bitrates.

In the METHOD_1 embodiment, PHY transceiver 20 transmits an average number of 7200/2=3600 bits of data payload over a frame of 1350 PAM symbols. In this case, when the PHY transceiver is configured to a 2.5 Gbps bitrate mode, clock generator 96 generates a baud rate clock of 937.5 Mbaud, which represents a 25% increase over the 750 Mbaud of the 1000BASE-T1 standard.

In another embodiment denoted METHOD_2, for both even and odd frames, 63-bit extension part 308 comprises a 36-bit XGMII field, a PAD18 field and an OAM9 field. In this embodiment, the PHY transceiver transmits 3616 bits of data payload over a frame of 1350 PAM8 symbols. To achieve a 2.5 Gbps bitrate, clock generator 96 generates a baud rate clock of 933.35 Mbaud, which represents a 24.4% increase over the 750 Mbaud of the 1000BASE-T1 standard.

In another embodiment denoted METHOD_3, a subsequent XGMII block that comprises 32 data bits and 4 control bits is split between an even frame and a subsequent odd frame. In this embodiment, the 63-bit extension part comprises a 36-bit XGMII field, an 18-bit XGMII-SPLIT field (half of the 32 data bits and 4 control bits of additional XGMII transfer) and an OAM9 field. In this embodiment, the PHY transceiver transmits 3634 bits of data payload over a frame of 1350 PAM8 symbols. To achieve a 2.5 Gbps bitrate, clock generator 96 generates a baud rate clock of 929.2 Mbaud, which represents a 23.8% increase over the 750 Mbaud of the 1000BASE-T1 standard.

In an embodiment denoted METHOD_4, a XGMII block is split between an even frame and the following odd frame. In this embodiment, the 63-bit extension part comprises a 18-bit XGMII-SPLIT field, a PAD36 field comprising 36 pad bits, and a OAM9 field. In this embodiment, the PHY transceiver transmits 3600 bits of data payload over a frame of 1350 PAM8 symbols. In this embodiment, to achieve a 2.5 Gbps bitrate, clock generator 96 generates a baud rate clock of 937.5 Mbaud, which is a 25% increase over the 750 Mbaud of the 1000BASE-T1 standard. In this embodiment, the baud rate clock frequency is a convenient multiple of the 25 MHz or 156.25 MHz reference clock, as described above.

Figure 7:
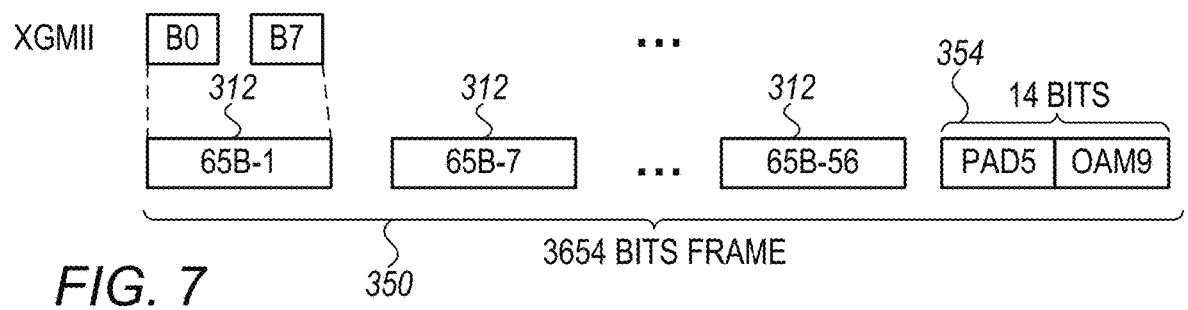
FIG. 7 is a diagram that schematically illustrates a PCS encoding and framing scheme applicable at bitrates higher than 1 Gbps, in accordance with another embodiment that is described herein.

FIG. 7 is a diagram that schematically illustrates a PCS encoding and framing scheme applicable at bitrates higher than 1 Gbps, in accordance with another embodiment that is described herein.

Unlike the embodiments of FIG. 6, in the present embodiment, the MG TX-PCS does not apply a 512B/513B transcoding, which reduces latency and simplifies the MG TX-PCS. In the present embodiment, a 3654-bit frame 350 comprises 56 65-bit blocks denoted 65B-1 . . . 65B-56, and a 14-bit extension part 354. In an embodiment, the extension part comprises a 5-bit PADS field and a 9-bit OAM9 field.

In the embodiment of FIG. 7, the PHY transceiver transmits 3584 bits of data payload over a RS FEC frame of 1350 PAM8 symbols. To achieve a 2.5 Gbps bitrate, clock generator 96 generates a baud rate clock of 2.5 Gbps·(4050/3584)/(3 bits/symbol)=941.6853 Mbaud, which is a 25.56% increase over the 750 Mbaud of the 1000BASE-T1 standard. The framing and encoding scheme for the reference 1000BASE-T1 standard was described with reference to FIG. 2, above.

In the embodiments described in FIGS. 6 and 7, the various pad bits, are used for purposes such as transferring additional OAM bits, CRC code bits and/or for vendor proprietary purposes, as described above.

The embodiments described above are given by way of example, and other suitable embodiments can also be used.

Although the embodiments described herein mainly address twisted pair wired media, the methods and systems described herein can also be used in other applications, such as in Printed Circuit Board (PCB) backplane or wireless communications.

It is noted that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A method for communication, comprising:
   in a Physical Layer (PHY) transceiver, selecting a transmission bitrate from a plurality of predefined transmission bitrates that respectively differ one from another, for transmitting over a media interface a plurality of bits received for transmission from a device external to the PHY transceiver;
   processing the received bits, by generating, using a framing and encoding scheme that is dependent on at least the selected transmission bitrate, one or more frames having a predefined frame length that is common among framing and encoding schemes for transmitting the received bits at the predefined transmission bitrates;
   encoding the bits of the one or more frames, so as to produce one or more respective code words of a predefined Forward Error Correction Code (FEC) code, using a single FEC encoder that accepts a number of bits for encoding equal to the predefined frame length, wherein the single FEC encoder is reused among the framing and encoding schemes for transmitting the received bits at one of the predefined plurality of transmission bitrates;
   mapping sub-units of the code words into transmission symbols for transmitting over the media interface using one of at least two different mapping schemes that respectively employ different voltage amplitude levels to define a transmission symbol, the mapping scheme being selected according to the selected transmission bitrate; and
   transmitting the transmission symbols over the media interface.

2. The method according to claim 1, wherein processing the received bits comprises processing the received bits using a first framing and encoding scheme when the selected transmission bitrate is a lowest transmission bitrate among the plurality of transmission bitrates, and using a second framing and encoding scheme, that is different from the first framing and encoding scheme, when the selected transmission bitrate is higher than the lowest transmission bitrate, wherein the first framing and encoding scheme is specified in a 1000BASE-T1 standard for 1 Gbs Ethernet communication over a twisted-pair link.

3. The method according to claim 1, wherein selecting the transmission bitrate comprises selecting a transmission bitrate other than a lowest transmission bitrate among the plurality of transmission bitrates, and comprising establishing a link with a peer link partner by performing a link training process specified for the lowest transmission bitrate.

4. The method according to claim 1, wherein mapping the sub-units comprises mapping 3-bit units into 3-level PAM symbols when the selected transmission bitrate is a lowest transmission bitrate among the plurality of transmission bitrates, and into 8-level PAM symbols when the selected transmission bitrate is higher than the lowest transmission bitrate.

5. The method according to claim 1, further comprising receiving the received bits in single-byte units when the selected transmission bitrate is a lowest transmission bitrate among the plurality of transmission bitrates, and in four-byte units when the selected transmission bitrate is higher than the lowest transmission bitrate.

6. The method according to claim 1, wherein processing the received bits comprises packing a predefined number of the received bits in the frames to match a baud rate derived from a common Ethernet reference clock signal.

7. The method according to claim 1, wherein generating each of the one or more frames, when the selected transmission bitrate is higher than the lowest transmission bitrate, comprises encoding eight-byte groups of the received bits into respective sub-frames having a predefined length, and aggregating a predefined number of the sub-frames and an extension part to match the predefined frame length.

8. An apparatus, comprising:
   an interface configured to receive bits for transmission over a media interface, wherein the bits are received from a device external to the apparatus at a transmission bitrate selected from a plurality of predefined transmission bitrates that respectively differ from one another;

a single Forward Error Correction Code (FEC) encoder
that produces code words of a predefined FEC code,
wherein the FEC encoder is reused for any transmission
bitrate selected from the plurality of the predefined
transmission bitrates, and accepts a number of bits for
encoding equal to a predefined frame length;
a mapper/modulator, configured to:
process the received bits, by generating, using a framing and encoding scheme that is dependent on at least the selected transmission bitrate, one or more frames having a predefined frame length that is common among framing and encoding schemes for transmitting the received bits at the predefined transmission bitrates;
encode the bits of the one or more frames using the FEC encoder, so as to produce one or more respective code words of the predefined FEC code;
map sub-units of the code words into transmission symbols for transmitting over the media interface using one of at least two different mapping schemes that respectively employ different voltage amplitude levels to define a transmission symbol, the mapping scheme being selected according to the selected transmission bitrate;
transmit the transmission symbols over the media interface; and
a processor, configured to select the transmission bitrate from the plurality of the predefined transmission bitrates, and to configure the FEC encoder and the mapper/modulator with the selected transmission bitrate.

9. The apparatus according to claim 8, wherein the mapper/modulator is configured to process the received bits using a first framing and encoding scheme when the selected transmission bitrate is a lowest transmission bitrate among the plurality of transmission bitrates, and using a second framing and encoding scheme that is different from the first framing and encoding scheme, when the selected transmission bitrate is higher than the lowest transmission bitrate, wherein the first framing and encoding scheme is specified in a 1000BASE-T1 standard for 1 Gbs Ethernet communication over a twisted-pair link.

10. The apparatus according to claim 8, wherein the processor is configured to select a transmission bitrate other than a lowest transmission bitrate among the plurality of transmission bitrates, and to establish a link with a peer link partner by performing a link training process specified for the lowest transmission bitrate.

11. The apparatus according to claim 8, wherein the mapper/modulator is configured to map the sub-units by mapping 3-bit units into 3-level PAM symbols when the selected transmission bitrate is a lowest transmission bitrate among the plurality of transmission bitrates, and into 8-level PAM symbols when the selected transmission bitrate is higher than the lowest transmission bitrate.

12. The apparatus according to claim 8, wherein the interface is configured to receive the bits in single-byte units when the selected transmission bitrate is a lowest transmission bitrate among the plurality of transmission bitrates, and in four-byte units when the selected transmission bitrate is higher than the lowest transmission bitrate.

13. The apparatus according to claim 8, wherein the mapper/modulator is configured to process the received bits by packing a predefined number of the received bits in the frames to match a baud rate derived from a common Ethernet reference clock signal.

14. The apparatus according to claim 8, wherein the mapper/modulator is configured to generate each of the one or more frames, when the selected transmission bitrate is higher than the lowest transmission bitrate, by encoding eight-byte groups of the received bits into respective sub-frames having a predefined length, and aggregating a predefined number of the sub-frames and an extension part to match the predefined frame length.

15. A method for communication, comprising:
in a Physical Layer (PHY) transceiver, selecting a transmission bitrate, from among a plurality of predefined transmission bitrates that respectively include a 1 Gbps bitrate and one or more of a 2.5 Gbps, 5 Gbps and 10 Gbps transmission bitrate, for transmitting over a media interface a plurality of bits received for transmission from a device external to the PHY transceiver;
processing the received bits and additional bits to generate one or more frames having a predefined frame length, using a framing and encoding scheme that for the 1 Gbps transmission bitrate processes the received bits and the additional bits according to a 1000BASE-T1 mode of transmission;
encoding the bits of the one or more frames, using a Forward Error Correction (FEC) code encoder for transmission according to the 1000BASE-T1 mode of transmission, to produce a plurality of code words of a respective FEC code;
selectively mapping sub-units of the code words into transmission symbols according to (i) a 3-level PAM modulation scheme for transmitting the received bits over the media interface at the 1 Gbps transmission bitrate according to 1000BASE-T1 mode, or (ii) according to a higher level PAM modulation scheme for transmitting the received bits over the media interface at a transmission bitrate that is higher than the 1 Gbps transmission bitrate; and
transmitting the transmission symbols over the media interface according to the selected mapping.

16. The method according to claim 15, wherein selecting the transmission bitrate comprises selecting a transmission bitrate higher than 1 Gbps, and wherein processing the received bits comprises processing the received bits using a framing and encoding scheme that is different from the framing and encoding scheme specified for the 1000BASE-T1 mode of transmission, and that is dependent on the selected transmission bitrate.

17. The method according to claim 15, wherein the FEC code encoder comprises a Reed Solomon (RS) encoder that is reused among the plurality of transmission bitrates, wherein the RS encoder accepts for encoding a frame having the predefined frame length, independently from the selected transmission bitrate.

18. The method according to claim 15, wherein the higher level PAM modulation scheme maps 3-bit units of the code words into 8-level PAM symbols.

19. An apparatus for communication, comprising:
a processor, configured to select a transmission bitrate, from among a plurality of predefined transmission bitrates that respectively include a 1 Gbps bitrate and one or more of a 2.5 Gbps, 5 Gbps and 10 Gbps transmission bitrate;
an interface configured to receive from a device external to the apparatus a plurality of bits for transmission over a media interface; and
a mapper/modulator, configured to:
process the received bits and additional bits to generate one or more frames having a predefined frame length, using a framing and encoding scheme that for the 1 Gbps transmission bitrate processes the received bits and the additional bits according to a 1000BASE-T1 mode of transmission;

encode the bits of the one or more frames, using a Forward Error Correction (FEC) code encoder for transmission according to the 1000BASE-T1 mode of transmission, to produce a plurality of code words of a respective FEC code;

selectively map sub-units of the code words into transmission symbols according to (i) a 3-level PAM modulation scheme for transmitting the received bits over the media interface at the 1 Gbps transmission bitrate according to 1000BASE-T1 mode, or (ii) according to a higher level PAM modulation scheme for transmitting the received bits over the media interface at a transmission bitrate that is higher than the 1 Gbps transmission bitrate; and transmit the transmission symbols over the media interface according to the selected mapping.

20. The apparatus according to claim 19, wherein the processor is configured to select the transmission bitrate by selecting a transmission bitrate higher than 1 Gbps, and wherein the mapper/modulator is configured to process the received bits using a framing and encoding scheme that is different from the framing and encoding scheme specified for the 1000BASE-T1 mode of transmission, and that is dependent on the selected transmission bitrate.

21. The apparatus according to claim 19, wherein the FEC code encoder comprises a Reed Solomon (RS) encoder that is reused among the plurality of transmission bitrates, wherein the mapper/modulator is configured to provide the RS encoder with a frame having the predefined frame length, independently from the selected transmission bitrate.

22. The apparatus according to claim 19, wherein the higher level PAM modulation scheme maps 3-bit units of the code words into 8-level PAM symbols.

\* \* \* \* \*